United States Patent
Parbaud et al.

(10) Patent No.: US 8,253,209 B2
(45) Date of Patent: Aug. 28, 2012

(54) ELECTROMECHANICAL DEVICE COMPRISING ELECTRONIC COMPONENTS AND AT LEAST ONE NANOTUBE-BASED INTERFACE, AND MANUFACTURING METHOD

(75) Inventors: Serge Parbaud, Saint Marcel les Valence (FR); Claude Sarno, Etoile/Rhone (FR)

(73) Assignee: Thales, Neuilly sur Seine (FR)

( * ) Notice: Subject to any disclaimer, the term of this patent is extended or adjusted under 35 U.S.C. 154(b) by 500 days.

(21) Appl. No.: 12/504,718

(22) Filed: Jul. 17, 2009

(65) Prior Publication Data
US 2010/0013034 A1 Jan. 21, 2010

(30) Foreign Application Priority Data
Jul. 18, 2008 (FR) ...................... 08 04114

(51) Int. Cl.
*H01L 29/84* (2006.01)

(52) U.S. Cl. . 257/415; 257/414; 257/417; 257/E29.324; 257/E21.499

(58) Field of Classification Search .................. 257/415, 257/417, 414, E29.324, E21.499
See application file for complete search history.

(56) References Cited

U.S. PATENT DOCUMENTS

| | | | |
|---|---|---|---|
| 6,394,815 B1 | 5/2002 | Sarno et al. | |
| 6,498,728 B1 | 12/2002 | Sarno et al. | |
| 6,661,664 B2 | 12/2003 | Sarno et al. | |
| 6,695,520 B1 | 2/2004 | Sarno et al. | |
| 7,286,365 B2 | 10/2007 | Sarno et al. | |
| 7,505,267 B2 | 3/2009 | Sarno et al. | |
| 2002/0020491 A1* | 2/2002 | Price et al. | 156/307.1 |
| 2006/0068195 A1* | 3/2006 | Majumdar et al. | 428/323 |
| 2007/0101812 A1* | 5/2007 | MacGugan | 73/493 |
| 2007/0155136 A1* | 7/2007 | Chrysler et al. | 438/478 |
| 2008/0273316 A1 | 11/2008 | Sarno et al. | |
| 2008/0308953 A1* | 12/2008 | Autumn et al. | 257/783 |

FOREIGN PATENT DOCUMENTS
WO WO 2006/048846 5/2006

OTHER PUBLICATIONS
U.S. Appl. No. 12/518,703, Serge Parbaud, et al.
Douglas Campbell, Rory Barret, Mark S. Lake, Larry Adams, Erik Abramson, Development of a Novel, Passively Deployed Roll-Out Solar Array, US, date unknown.

* cited by examiner

*Primary Examiner* — Nathan Ha
*Assistant Examiner* — Yu-Hsi D Sun
(74) *Attorney, Agent, or Firm* — LaRiviere, Grubman & Payne, LLP

(57) ABSTRACT

The invention relates to an electromechanical device comprising a package and at least one component surface-mounted in the package, characterized in that it also comprises at least one nanotube-based interface providing a mechanical link for vibratory and thermal filtering between said component and the package.

Advantageously, the nanotube-based interface can also serve as an electrical and/or thermal interface with the electrical contacts with which the package is equipped.

5 Claims, 3 Drawing Sheets

ELECTROMECHANICAL DEVICE COMPRISING ELECTRONIC COMPONENTS AND AT LEAST ONE NANOTUBE-BASED INTERFACE, AND MANUFACTURING METHOD

PRIORITY CLAIM

This application claims priority to French Patent Application Number 08 04114, entitled Electromechanical Device Comprising Electronic Components and At Least One Nanotube-Based Interface, and Manufacturing Method, filed on Jul. 18, 2008.

BACKGROUND OF THE INVENTION

The field of the invention is that of electromechanical devices and notably that of devices including gyrometer or accelerometer-type sensors designed to be able to be mounted onboard craft or munitions and likely to be subject to very high thermal and mechanical stresses.

Generally, such components are surface-mounted on a substrate via a block onto which these components are glued.

They can also be surface-mounted by soldering directly on the substrate or on the encapsulation package.

These interface elements more often than not have limitations in terms of vibration, thermal expansion or even in terms of impact resistance. Furthermore, they have a tendency to introduce biases which generate drift at the level of the sensor-type components which, by the same token, represent a problem in terms of reliability.

BRIEF DESCRIPTION OF THE INVENTION

In this context, the subject of the present invention is an electromechanical device with which to surface-mount these components by limiting the mechanically or thermally originated stresses, in which the electronic components are added to a support via carbon nanotubes or structures based on carbon nanotubes, of which it is possible to exploit the performance characteristics both in terms of excellent mechanical resistance and in terms of very good thermal and electrical conductivity.

More specifically, the subject of the invention is an electromechanical device comprising at least one component surface-mounted on a support, characterized in that it also comprises at least one mechanical or electromechanical interface for vibratory and thermal filtering based on nanotubes providing the link between said component and the support.

According to a variant of the invention, the nanotubes are carbon nanotubes.

According to a variant of the invention, the interface comprises a film of nanotubes.

According to a variant of the invention, the interface is made up of discrete nanotube-based structures (for example, bonding-type wires, thin plates, etc.).

According to a variant of the invention, the interface also provides the electrical link between the component and its support.

According to a variant of the invention, the interface also provides the thermal link between the component and its support.

According to a variant of the invention, the support is incorporated in a package.

According to a variant of the invention, the interface comprises a layer of oriented nanotubes.

According to a variant of the invention, the device also comprises glue elements for providing the link for the nanotube-based interface with the support, said interface being on the surface of the component.

According to a variant of the invention, the device also comprises soldering elements with which to provide the link for the nanotube-based interface with the support, said interface being on the surface of the component.

According to a variant of the invention, the glue elements are based on organic adhesive conductive material, commonly called "ACAs".

According to a variant of the invention, with the package also comprising electrical contacts with which to electrically address said component, the nanotube-based interface provides a mechanical and electrical interface function.

According to a variant of the invention, with the support also comprising electrical contacts with which to electrically address said component, the device also comprises a secon interface providing the electrical contact between the electrical component and said electrical contacts.

According to a variant of the invention, the package comprises a bottom substrate, lateral walls and a secondary support, the electronic component being added on mechanically via the nanotube-based interface at the level of said secondary support.

According to a variant of the invention, the secondary support is a printed circuit.

According to a variant of the invention, the component is of MEMS (micro-electro-mechanical system) type.

According to a variant of the invention, the component is an inertial sensor.

According to a variant of the invention, the component is an accelerometer.

According to a variant of the invention, the component is a gyrometer.

The subject of the invention is a method of manufacturing a device according to the invention comprising the following steps:

production of a nanotube-based interface on the surface of an electronic component;

surface mounting, on the nanotube interface side, of the electronic component on a substrate.

Advantageously, the surface mounting can be performed by gluing via a glue that can notably be of the type of glue based on polymer containing conductive particles.

LIST OF THE DRAWINGS

The invention will be better understood and other benefits will become apparent from reading the following description, given by way of nonlimiting example, and from the appended figures in which:

FIGS. 1a and 1b diagrammatically represent a first variant of the invention, in which the nanotube-based interface provides a mechanical function;

FIG. 2 diagrammatically represents a variant of the invention including an intermediate surface-mounting support;

FIGS. 3a and 3b diagrammatically represent a variant of the invention, in which the nanotube-based interface provides a mechanical link and an electrical link;

DETAILED DESCRIPTION

Figure 1A:
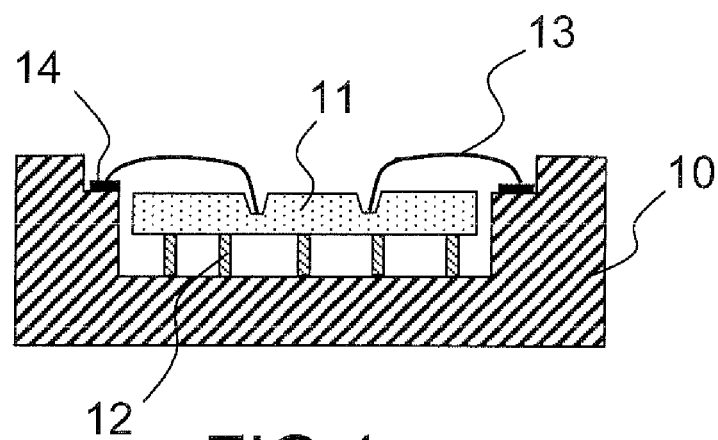

The benefits of the nanotubes and, more particularly, of the nanotubes that will hereinafter be called "carbon nanotubes" (CNT), lie notably in their following properties:
- a Young's modulus of the order of 1 TPa;
- a very strong mechanical resistance of the order of 100 GPa;
- a very good electrical conductivity.

Different variants of the invention will be described using simplified diagrams that represent the nanotube-based interfaces. These interfaces can be obtained by growing nanotubes on the surface of a component using techniques of the known art or by surface mounting via soldering or gluing techniques.

They can also be produced from solutions in which the nanotube are dispersed, these solutions being able to be coated over the surface of the component before the latter is surface mounted on a substrate.

More specifically, the substrate is coated with a solution containing carbon nanotubes. This operation is performed at ambient temperature, unlike the nanotube-growing operations performed at higher temperature. It is therefore a non-aggressive operation that also allows for a very good distribution of the elements providing the thermal conduction on the surface of all the electronic components.

Typically, to produce the nanotube solution, it is possible to use solvents of the following types: dimethylmethylformamide (DMF) or dichloroethane (DCE) or N-methyl-2-pyrrolidone (NMP) or dichlorobenzene (DCB) or water+sodium dodecyl sulphate (SDS).

The method used to obtain an optimal dispersion can be as follows:
- addition of approximately 1 mg of carbon nanotubes in 20 ml of solvent (these values are purely indicative and consequently the quantities are adjusted and optimized to obtain the desired thermal conductivity).
- use of an appliance that intermittently sends ultrasounds, called sonicator, to "sonicate" said solution. In practice, the ultrasounds help to separate the strings of nanotubes that have a tendency to form because of the Van Der Walls forces.
- application of a centrifical process to the solution in a vessel so as to retain at the bottom of the vessel all the strings that have not been separated by sonication, and the other forms of impurities, for example residues of metallic catalysts.

The solution obtained in this way can then be deposited in a conventional manner on the surface of the substrate comprising the electronic components.

Typically, a solution can be coated on by spraying with a spray of solution or with microdroplets or with an inkjet machine.

After evaporation of the solvent, a mat of nanotubes is obtained with the nanotubes distributed randomly.

In order to improve the thermal conductivity properties of the mat of carbon nanotubes formed on the surface of the electronic components, it is also possible to employ directed coating techniques.

For this, it is possible to use techniques such as electrophoresis, use of a magnetic field, deposition then drying under a directed gas stream, etc.

According to the present invention, it is thus proposed to use an interface based on this type of nanomaterials to make it possible to obtain a component with fewer thermal stresses and which is capable of receiving the signals needed for its control, that is of very good quality.

According to a first variant of the invention illustrated in FIG. 1a, an electronic component 11 is surface-mounted on a substrate 10 that can be an integral part of a package, via a nanotube interface 12, providing a mechanical surface-mounting function. The electrical addressing of the component is achieved via conventional conductive elements 13 that are also connected to connection pads 14 with which the package is equipped.

Figure 1B:
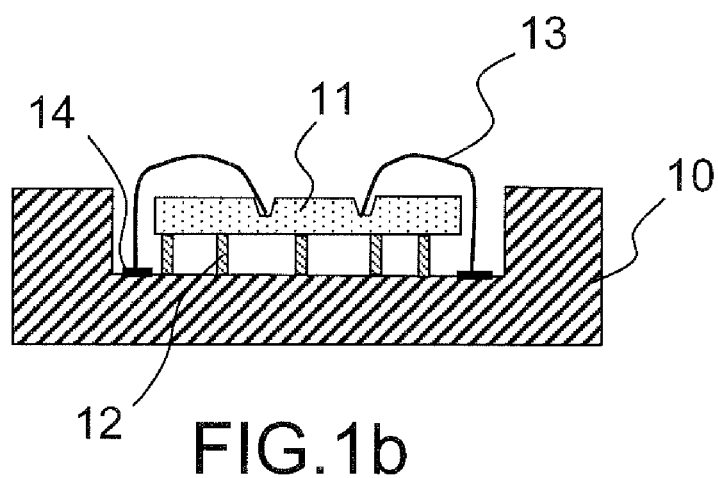

An alternative to this variant is illustrated in FIG. 1b; the connection pads 14 are situated at the level of the bottom of the package, that is at the substrate level.

Figure 2:
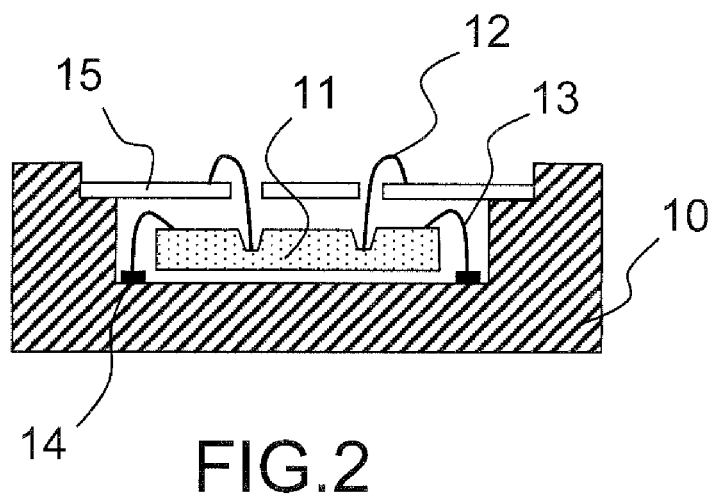

According to a second variant of the invention illustrated in FIG. 2, the device can be equipped with a secondary support 15, to which is mechanically added the electronic component 11; the mechanical interface comprising the nanotubes is thus produced between said intermediate support and the component. The package in this case includes an intermediate plane at the level of which the intermediate support is positioned.

The above variants of the invention exploit the very good mechanical properties of the nanotubes, but it is also possible to simultaneously exploit their electrical properties.

Figure 3A:
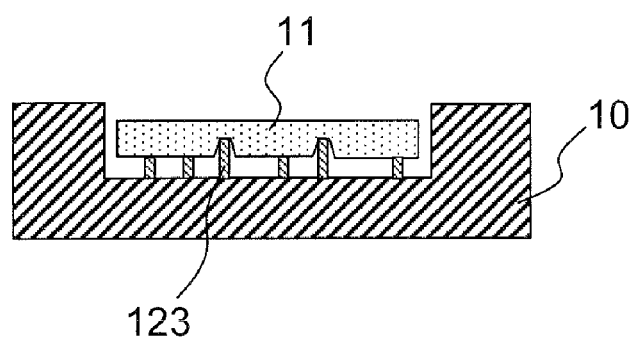

The variant illustrated in FIG. 3a thus relates to a device that uses nanotubes providing both the mechanical surface-mounting function and the electrical link function. According to this variant, the component 11 is mechanically and electrically linked to the package incorporating a substrate 10, via a nanotube interface 123.

Figure 3B:
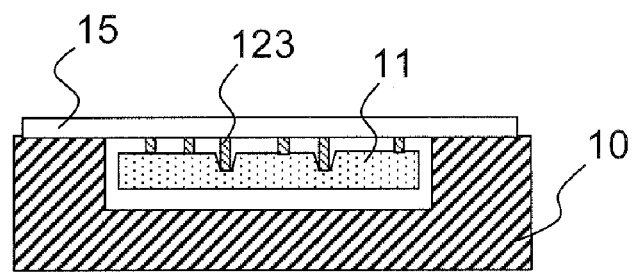

The variant illustrated in FIG. 3b relates to a configuration that uses an intermediate support 15 of printed circuit type.

Advantageously, the component on which the nanotube interface is first produced, can be placed in contact with a substrate via a conductive glue such as a glue of ACAs type.

Figure 4:
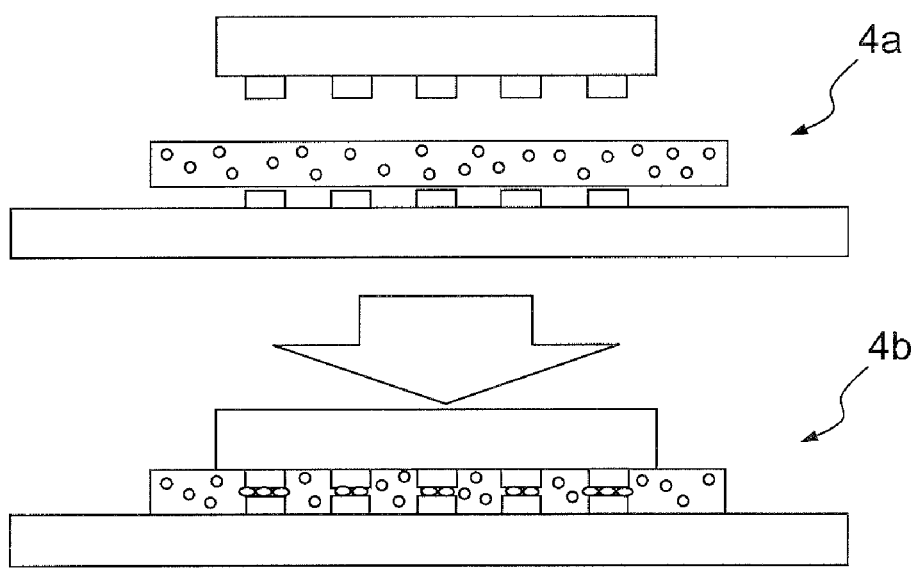
FIG. 4 illustrates the steps of a method of gluing using polymer filled with conductive particles that can advantageously be used in a method of manufacturing a device according to the invention.

To provide this link, in a first step 4a, a monomer solution containing conductive particles is coated onto the surface of the substrate, as illustrated in FIG. 4.

In a second step 4b, the monomer is polymerized by the application of a pressure or by a temperature rise, so as to produce the layer of conductive glue based on polymer containing conductive particles.

It should be noted that the surface-mounting of a component at the level of the package can entail surface-mounting on a surface of said component having different levels. For this, an interface with nanotubes of variable length must be produced.

The present invention has been described in a very schematic way in the context of a component surface-mounted in a package.

Figure 5A:
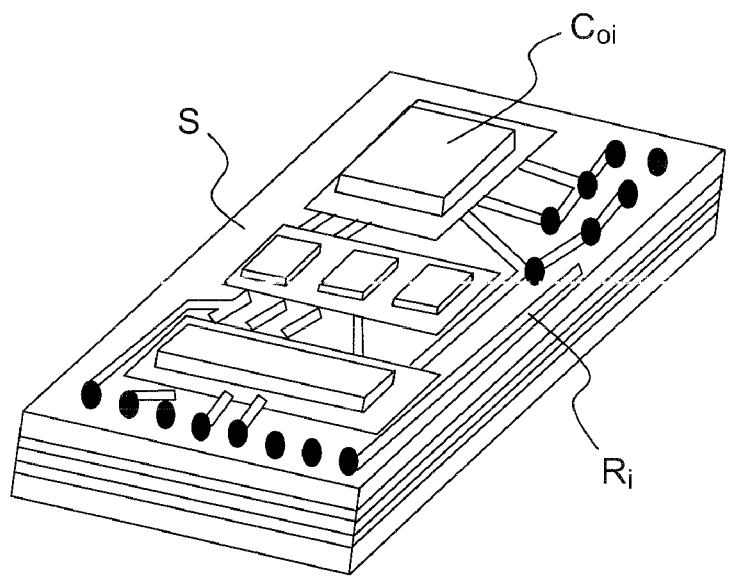
FIGS. 5a and 5b illustrate an exemplary device according to the invention comprising a package containing MEMS-type components.

Usually, the package employed contains a series of components $C_{oi}$ at the bottom of the package with a network of connections $R_i$ as illustrated in FIG. 5a.

Figure 5B:
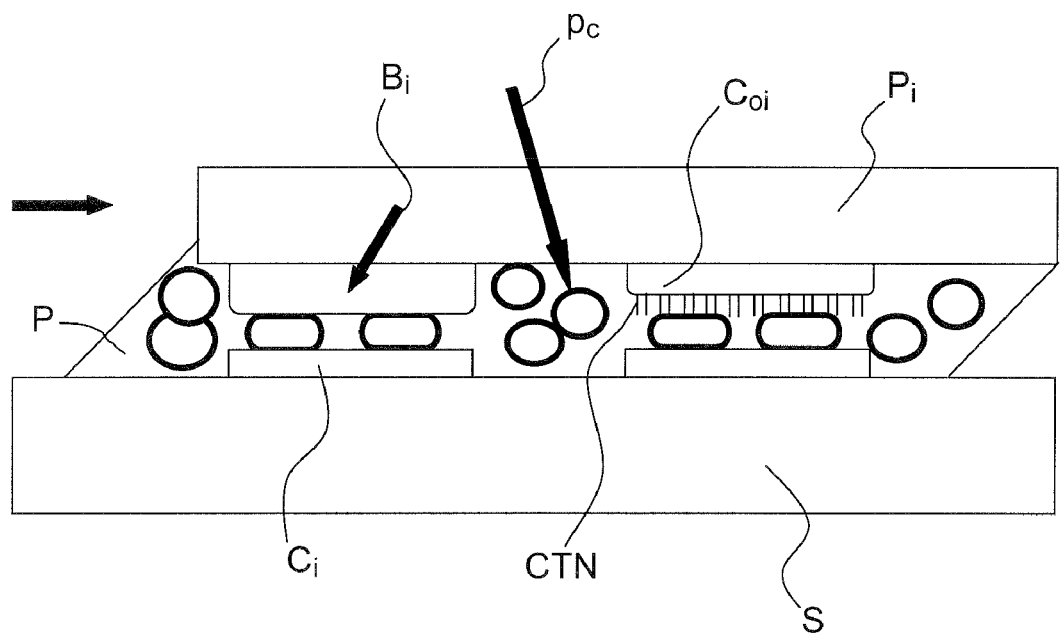

FIG. 5b is a cross-sectional view of one of the components $C_{oi}$. Advantageously, and according to the invention, the component comprises a nanotube-based interface, surface-mounted on the bottom of the package using a conductive glue such as that for which the preparation method is represented in FIG. 4.

Thus, on the surface of a substrate S, equipped with contacts $C_i$ belonging to the network of connections $R_i$, a component $C_{oi}$ mounted on a chip $P_i$ is mechanically and electrically surface-mounted.

The nanotube interface CTN is linked to said substrate via a polymer P containing conductive particles $p_c$.

Generally, the components employed can be based on silicon or any other semiconductive materials.

The packages employed can be of very widely varying types, and notably of silica, ceramic or other type.

The invention claimed is:

1. Electromechanical device comprising a first support (10), a secondary support (15) placed on the first support and at least one component (11) suspended from the secondary support, via a link (12) between said component (11) and the secondary support, the link (12) comprising structures based on carbon nanotubes adapted to provide a mechanical or electromechanical interface for vibratory and thermal filtering.

2. Electromechanical device according to claim 1, in which the secondary support comprises electrical contacts making it possible to electrically address said component.

3. Electromechanical device according to one of claim 1, in which the at least the first support or the secondary support is incorporated in a package.

4. Device according to claim 1, in which the component is of mechanical microsystem type (MEMS).

5. Device according to claim 1, in which the component is of inertial sensor type.

* * * * *